United States Patent [19]

Noda et al.

[11] Patent Number: 4,569,624
[45] Date of Patent: Feb. 11, 1986

[54] LINEAR TRANSFER DEVICE FOR WAFERY WORKS

[76] Inventors: Minoru Noda; Tsutomu Miyata; Yoshihiro Yamashita; Kenji Ohmura, all of 31-1 Kameido 6-chrome, Koto-ku, Tokyo, Japan

[21] Appl. No.: 556,292

[22] Filed: Nov. 30, 1983

[30] Foreign Application Priority Data

Dec. 1, 1982 [JP] Japan .............................. 57-210973

[51] Int. Cl.$^4$ ............................................. B65H 1/00
[52] U.S. Cl. .................................. 414/225; 414/751; 901/7
[58] Field of Search ................... 901/7; 414/225, 750, 414/751, 217

[56] References Cited

U.S. PATENT DOCUMENTS 4,311,427  1/1982  Coad et al. ................... 414/225 X
4,361,413 11/1982  Toda ............................ 414/225 X
4,449,885  5/1984  Hertel et al. .................. 414/750

*Primary Examiner*—William E. Wayner

*Attorney, Agent, or Firm*—Robert E. Burns; Emmanuel J. Lobato; Bruce L. Adams

[57] ABSTRACT

A linear transfer device for wafery works comprising: a work supporting means provided each in a work supplying station, one or more working stations and a work discharging station, which supports the works in erect positions in front thereof, the stations being linearly arranged with equal distances; a feeding means for axially feeding the work supporting means; a transfer bar capable of moving horizontally and vertically and holding means provided on the transfer bar which are adapted to face to the stations and have a pair of supporting grooves in order to support the work in an erect position, characterized in that the delivery or reception of the work supported by each work supporting means or each holding means can be made only by the vertical movement of the transfer bar relatively to each station and that the work supporting means can locate at the retreated positions in order to prevent from interfering with the holding means when the transfer bar is in movement.

1 Claim, 9 Drawing Figures

② ③

④ ⑤

⑥ ⑦

⑧ ⑨

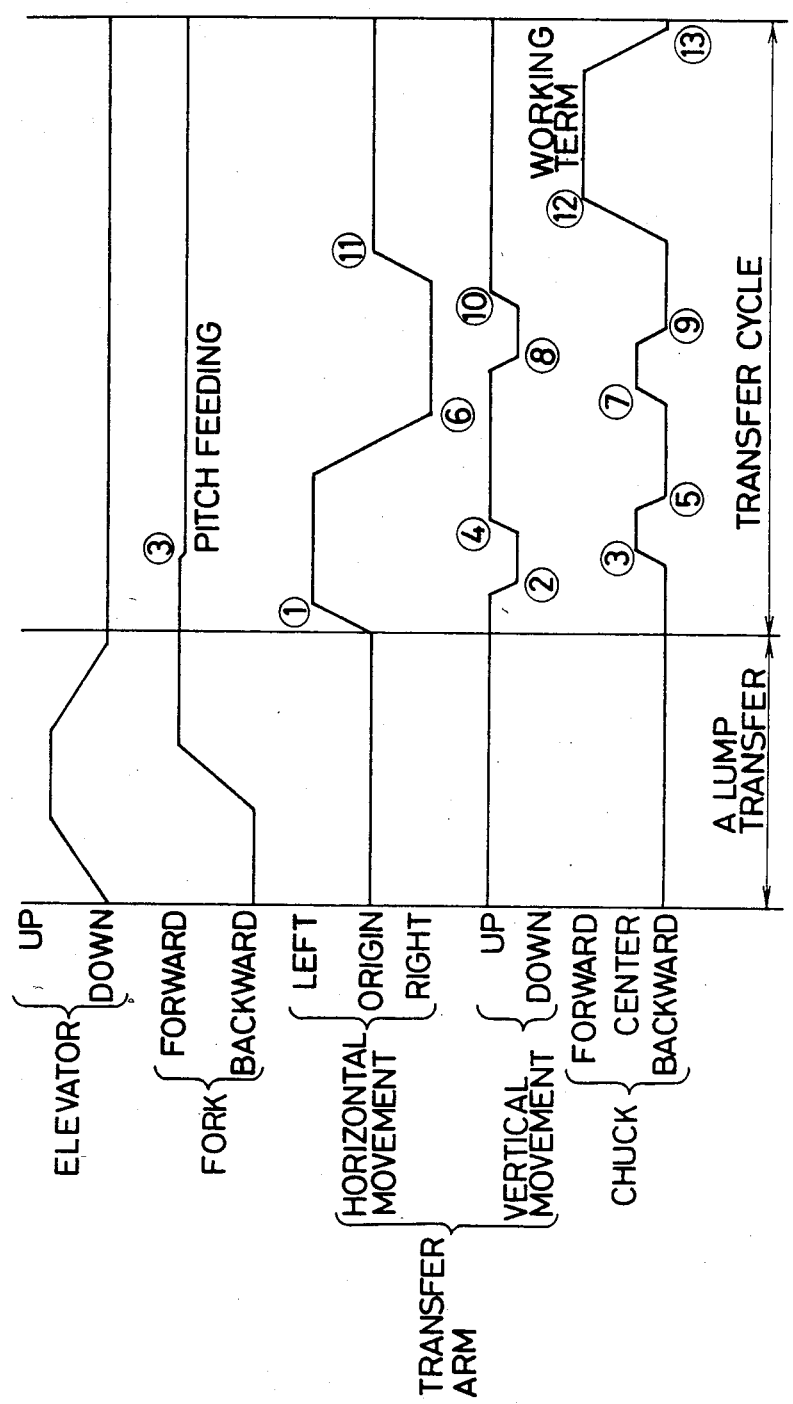

LINEAR TRANSFER DEVICE FOR WAFERY WORKS

BACKGROUND OF THE INVENTION

The present invention relates to a linear transfer device suitable for transferring wafery works, for example, silicon wafers.

In transferring wafery works such as silicon wafers from a supplying station to the following working stations to treat them, they have been transferred in lying positions because this position is the most stable.

In case of such transfer in a lying position, however, dusts tend to stick to the surfaces, and only a slight eccentric load applied on the wafers produces bending or internal stress exerting bad influences on the subsequent working processes, thereby lowering the yield.

To the contrary, if they are linearly transferred in erect positions, a chucking mechanism for securely holding them and its driving mechanism must be provided to make them stable, and such results in complexity of the construction of the device and high cost. In addition, such a chucking mechanism is not suitable for the works that must be delicately treated, such as silicon wafers, because it it too rigid for them. However, the linear transfer in an erect position is advantageous in respect that the adhesion of dusts and the production of bending or internal stress can be reduced.

The present invention was made in view of the abovementioned background and its objects is to provide a linear transfer device for wafery works which can transfer them to different stations while holding them in erect positions and which can receive or deliver them in each station.

To achieve the objects of this invention, the device is characterized in that the reception or delivery of the works can be made only by the vertical movement of a transfer bar relatively to each work supporting means and that the supporting means can be positioned at the retreated positions to prevent interference with the transfer bar when it is in movement.

BRIEF DESCRIPTION OF DRAWINGS

FIG. 4 is a time chart.

The present invention will be now be described in conjunction with the embodiment shown in the attached drawings, in which FIG. 1 shows an embodiment of the linear transfer device for silicon wafers to which this invention is applied.

In the figure the linear transfer device comprises a base plate 1 sealingly mounted to an opening formed on one side of a vacuum chamber (not shown), a work supplying station I, a first working station II, a second working station III, a work discharging station IV, the stations being equidistantly and linearly arranged on the base plate 1. A transfer bar 2 supported under the stations in the center portion of the plate 1 so as to move vertically and horizontally, a vertically movable elevator 3 is located under the work supplying station I, and a work cassette is mounted to be supplied from the outside to the intermediate position between the work supplying station I and a wafer holder 3a of the elevator 3 when it is at the lowest position. Under the work discharging station an elevator of the same construction as that of the elevator 3 is also movably fixed, though not shown, and a cassette take-out position is at the intermediate position between the work discharging station and the wafer holder of the elevator when it is at the lowest position.

Figure 1:
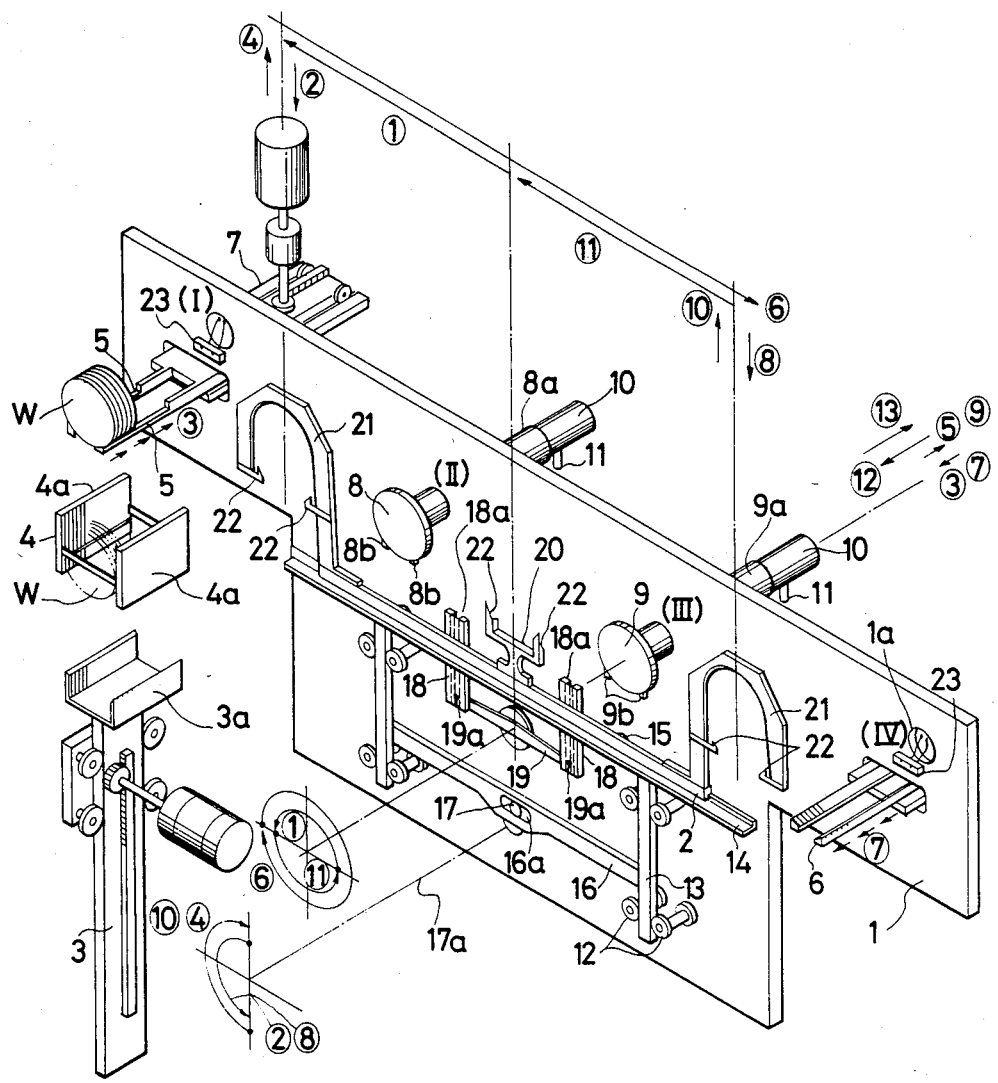
FIG. 1 is a perspective view of a linear transfer device for silicon wafers to which this invention is applied.

A supplying fork 5 and a discharging fork 6 are provided in the work supplying station I and the work discharging station IV, respectively. The forks 5 and 6 project in the vacuum chamber through the base plate 1, and are advanced or retreated pitch by pitch by a feeding means 7 provided at the back of the base plate 1 (only the feeding means for the fork 5 is shown in FIG. 1).

A number of work supporting grooves are formed at equipitches on the forks 5 and 6, and the width of the groove is a little larger than the thickness of a work or silicon wafer. The work cassette 4 has a pair of work supporting plates 4a on which formed are supporting grooves of the same width and pitch as those of the supporting grooves of the forks. At the top of the elevator 3 is fixed a wafer holder 3a having supporting grooves of the same width and pitch as those of the forks or the supporting plates 4a. And the width of the wafer holder 3a is larger than that of the fork 5 or 6 and smaller than the internal width of the supporting plates 4a.

Figures 2A, 2B:
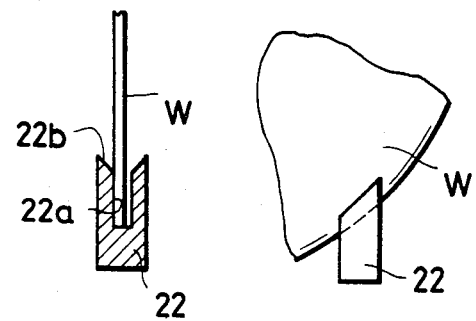
FIGS. 2a and 2b are enlarged partial sectional and front views of the chucking claw.
Figure 3B:
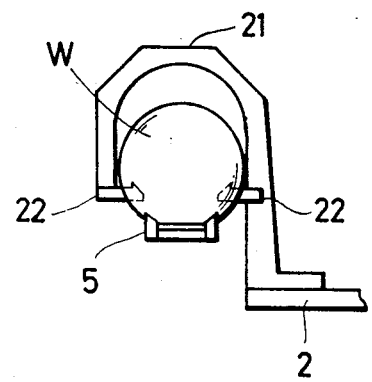
FIGS. 3B, C, E, F, and G are partial front views showing the reception and delivery of the wafers in a transfer cycle.
Figure 3C:
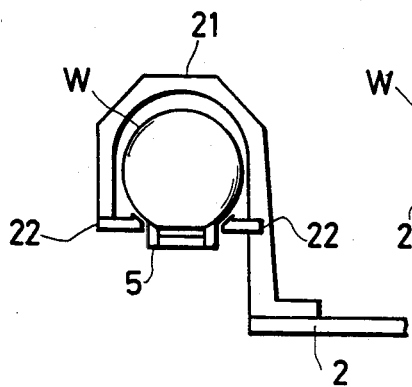
Figure 3E:
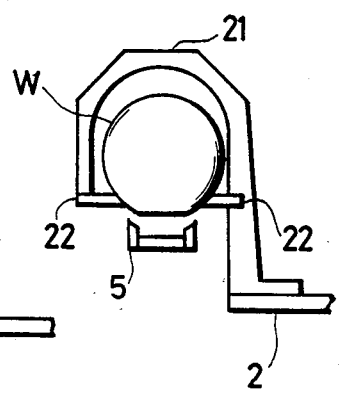
Figure 3F:
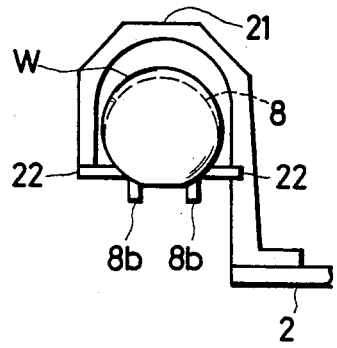
Figure 3G:
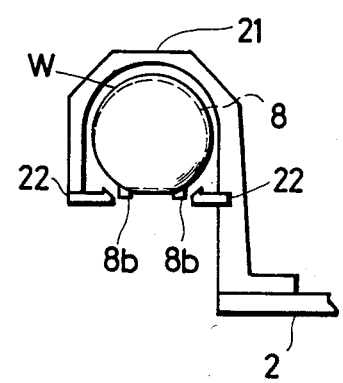

In each working station is provided a discoidal chucking plate 8,9 which supports the work in an erect position thereto, and a pair of chucking claws 8b, 9b are fixed at the lower portion of the chucking plate 8,9. The chucking claws 8b, 9b are similar to the chucking claws 22 described hereinafter with reference to FIG. 2. Air cylinders 10 for driving the chucking plates 8 and 9 are placed on the back side to advance or retreat the chucking plates relatively to working chambers (not shown) formed in the vacuum chamber, and changing air cylinders 11 control the advanced positions of the air cylinders where the work may be delivered or received to or from the chucking plate 8, 9.

In this embodiment, as a driving means for the rods 8a, 9a, the air cylinder 10 and the changing air cylinder 11 are used, but a cam and a cam-follower can be also used.

The transfer bar 2 is supported horizontally slidable by a guide roller 15 on a transfer guide bar 14, which is fixed to the upper end of a pair of vertically movable guide bars 13 being guided by guide rollers 12. The guide bars 13 are connected to each other by a connecting bar 16 having a slit 16a at the center thereof and in which is engaged an eccentric pin 17 eccentrically mounted on a driving shaft (not shown but its center line is shown by 17a). The guide bars 13 go up or down by every rotation of 180° of the driving shaft. The driving shaft is driven by a rotary actuator (not shown) mounted on the back of the base plate 1.

A pair of transfer roller guides 18 are connected to the transfer bar 2 at positions symmetrical to the center line thereof. Under the transfer guide bar 14 on the center line thereof is rotatably disposed a transfer arm 19 having rollers 19a at the ends which slide in the guiding grooves 18a of the roller guides 18. By such a construction the rotation of the transfer arm 19, which is driven by a motor (not shown) fixed on the back of the base plate 1, produces the horizontal movement of the transfer bar 2.

Work receiving arms 20 and 21 are fixed on the transfer bar 2 at the center and the ends, respectively, and each of the work receiving arms has a pair of chucking claws 22 facing each other. As shown in enlargement in FIGS. 2a and 2b, these chucking claws 22 have a groove 22a at the center whose width is slightly larger than the thickness of a work and have a guide portion 22b. Accordingly, the work can be supported at two lower peripheral positions by getting into the grooves 22a of the chucking claws 22. In the case of the chucking claws 8b, 9b, these are situated at the front side of the chucking plates 8, 9 and are similar in construction and operation to the chucking claws 22.

The left and right work receiving arms 21 are formed so as to overhang at the ends of the transfer bar 2 in order to prevent them from interfering with the forks 5,5, while the center work receiving arm 20 is formed in the general shape of a candlestand. And the three receiving arms are spaced apart the same distance as the width of a station. When the transfer bar 2 is at the original position, each of the work receiving arms is located at the intermediate position of the two adjacent stations. When the transfer arm 19 turns 180° counter clockwise, the three work receiving arms 21,20 and 21 are moved to the positions facing to the work supplying station I, the first working station II and the second working station III, respectively. On the other hand, the clockwise rotation of 180° of the transfer arm 19 moves the three work receiving arms to the positions facing to the first working station II, the second working station III and the work discharging station IV, respectively.

To detect the presence of the works, reflective photoelectric sensors 23 with a light projection means (not shown) are provided in the work supplying station I and the work discharging station IV, respectively, facing with one side thereof to the work and with the other side to the openings 1a formed in the base plate 1.

The manipulative actions of the device mentioned above will be explained referring to FIG. 1, FIG. 3 and FIG. 4 showing the time chart.

(A) (see FIG. 1) In the first state of the device, the transfer bar 2 is at the original position, each work receiving arm 20 or 21 is located at the intermediate position between two adjacent stations, the elevator 3 is standing by at the lowest position and the forks 5 and 6 and the chucking plate 8 are at their original positions.

As soon as the work cassette 4 holding a column of works therein is put in the vacuum chamber, as shown in FIG. 4, the elevator 3 starts ascending and when the wafer holder 3a passes through the cassette 4, the works held in it are collectively delivered to the wafer holder 3a where each work is supported by a pair of the supporting grooves thereof. The elevator 3 supporting the works continues ascending and stops at the position where the wafer holder 3a locates just over the fork 5 in the work supplying station I.

Then, the fork 5 advances until the supporting grooves thereof correspond with those of the wafer holder 3a. The works which were supported on the wafer holder are collectively handed over to the fork 5 in the supporting grooves in erect positions when the elevator 3 goes down.

Next, the transfer cycle which will be explained below is repeated after this delivery operation is completed.

(B)(see FIG.3B) The counterclockwise rotation of 180° of the transfer arm 19 (shown by ① in the figures) moves the transfer bar 2 in the left direction so as to face the work receiving arms 21, 20 and 21 to the work supplying station I, the first working station II and the second working station III, respectively. At this time, the fork 5 being at the most advanced position, the left work receiving arm 21 is located behind the last one of the work W supported on the fork 5, and the center arm 20 and the right arm 21, in front of the chucking plates 8 and 9 in the working stations II and III, respectively.

(C)(see FIG.3C) The counterclockwise rotation of 180° of the driving shaft with the eccentric pin 17 (shown by ② moves the transfer bar 2 downward, positioning the chucking claws of the work receiving arms outside of the fork 5 and chucking plates 8 and 9, respectively.

(D) Then the fork 5 retreats one pitch along the arrow ③ so that the last work W may place above the claws 22 of the left work receiving arm 21. This detection of the work is made by the photoelectric sensor 23. On the other hand, the chucking plates 8 and 9 of the working stations are advanced to the advanced positions to cooperate with the center arm 20 and the right arm 21, this advancement being controlled by the changing air cylinders 11 (shown by ③ in the figures).

(E)(see FIG. 3E) As the driving shaft with eccentric pin 17 turns 180° in the clockwise direction, the transfer bar 2 goes up, receiving the last work on the fork by the claws 22 of the left arm 21. At this time, the working stations II and III and the work discharging station IV are idle in the absence of the works in front of the chucking plates 8 and 9, but if they are, they are received by the claws of the center arm 20 and the right arm 21. After this receiving operation, the chucking plates 8 and 9 retreat to the original positions (shown by ④ and ⑤).

(F)(see FIG. 3F) The rotation of 360° of the transfer arm 19 in the clockwise direction moves the transfer bar 2 in the right direction by the length of a station and locates the left center and right arms in front of the first working station II, the second working station III and the work discharging station IV, respectively. In this stage, the chucking plates 8 and 9 of the working stations II and III advance to their advanced positions in order to cooperate with the left and the center arms 21 and 20 (shown by ⑥, ⑦), while the work discharging station IV is idle. The right work receiving arm 21 is not holding a work and the photoelectric sensor 23 does not detect it, accordingly the fork 6 remains at the original position.

(G)(see FIG. 3G) The rotation of 180° of the driving shaft with eccentric pin 17 in the counterclockwise direction descends the transfer bar 2 to hand over the work held by the left arm 21 to the chucking plate 8, which will support the lower periphery of the work by the chucking claws 8b. Then the chucking plates 8 and 9 return to their original positions (shown by ⑧, ⑨).

(H) The driving shaft with eccentric pin 17 rotates 180° in the clockwise direction to ascend the transfer bar 2 and then the transfer arm 19 turns 180° in the counterclockwise direction so that the transfer bar 2 returns to the original position.

(I) Next, the changing air cylinders 11 being off lock, the chucking plates 8 and 9 advance beyond the advanced position or work receiving position into working chambers (not shown), respectively, in which the work W supported by the chucking plate 8 is treated. After completion of the treatment the chucking plates 8 and 9 retreat to their original positions and one working and transferring process is terminated.

Thereafter, by repeating the actions (B) to (I) the work W treated in the first working station II is transferred to the second working station III to be treated with the second working, and simultaneously the last work supported on the fork 5 is transferred to the first working station II and treated with the first working as described above.

From the third transfer cycle, the work W which was treated in the second working station III is transferred to the work discharging station IV held by the right work receiving arm 21. As soon as the photoelectric sensor 23 detects the presence of the work, the fork 6 advances by pitch along the arrow ⑦ and receives the work from the right arm 21 on its end portion when the transfer bar 2 goes down.

Be repeating the transfer cycle (B) to (I), the works supported on the fork 5 in the work supplying station I are successively transferred to the first and the second working stations II and III and to the work discharging station IV where the all processed works are accumulated on the fork 6. After the accumulated works on the fork 6 are collectively delivered to an elevator (not shown) in the reverse manner, the fork 6 retreats to the original position, and the elevator goes down collectively delivering the works to the cassette which is standing by under the fork 6. The transfer process is completed by taking out the cassette filled with the works from the take-out position.

In this embodiment, chucking claws are used as means for holding works to the chucking plates 8 and 9, but it goes without saying that other types of chucking mechanisms, for example, vacuum chucking, electrostatic chucking or other claw chucking can be also used. Additionally, the effect of the device is the same in case two or more working stations are provided.

In the device according to this invention, as detailed before, the delivery of the works in erect positions to the supporting means or the holding means of the transfer bar 2 can be made only by the vertical movement of the transfer bar relatively to each station, and the supporting means axially retreat to prevent from interfering with the chucking mechanism when the transfer bar 2 is in movement, resulting in that the device can be of simple construction and wafery works can be transferred to each station while held in erect positions.

Accordingly, if the device according to this invention is applied to a working device for silicon wafers, for example, the adhesion of dusts on the wafers can be reduced and the yield can be improved since a bending or internal stress due to an eccentric load applied on them is hard to produce as compared with the conventional transfer in a lying position. Moreover, as they are transferred supported only by a pair of chucking claws and the chucking force does not influence on them, they are free from damages. And this device can be used in a production process line.

What is claimed is:

1. A linear transfer device for wafery works comprising: a work supporting means disposed at each of a work supplying station, one or more working stations and a work discharging station, for supporting the works in erect positions in front thereof, the stations being linearly arranged at equal distances; a feeding means for axially feeding the work supporting means; a transfer bar mounted for moving horizontally and vertically; and a plurality of holding means provided on the transfer bar for movement therewith and each having a pair of supporting grooves in order to support the work in an erect position, characterized in that the delivery or reception of the work supported by each work supporting means or each holding means can be made only by the vertical movement of the transfer bar relatively to each station and that the work supporting means can locate at the retreated positions in order to prevent the same from interferring with the holding means when the transfer bar is in movement.

* * * * *